United States Patent
Chen et al.

(10) Patent No.: US 11,507,150 B2
(45) Date of Patent: Nov. 22, 2022

(54) INTERFACE CARD CAGE AND SERVER

(71) Applicants: INVENTEC (PUDONG) TECHNOLOGY CORPORATION, Shanghai (CN); INVENTEC CORPORATION, Taipei (TW)

(72) Inventors: Zhifa Chen, Shanghai (CN); Sheng Guo, Shanghai (CN)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 0 days.

(21) Appl. No.: 17/153,764

(22) Filed: Jan. 20, 2021

(65) Prior Publication Data
US 2021/0373618 A1    Dec. 2, 2021

(30) Foreign Application Priority Data
May 29, 2020    (CN) .......................... 202010478042.1

(51) Int. Cl.
*G06F 1/18*        (2006.01)
*H05K 7/14*        (2006.01)

(52) U.S. Cl.
CPC ........... *G06F 1/185* (2013.01); *H05K 7/1407* (2013.01)

(58) Field of Classification Search
CPC ........ G06F 1/185; G06F 1/186; H05K 7/1407
See application file for complete search history.

(56) References Cited

U.S. PATENT DOCUMENTS

| | | | |
|---|---|---|---|
| 7,990,732 B2 * | 8/2011 | Kuo ...................... | H05K 7/1408 361/754 |
| 8,947,876 B2 * | 2/2015 | Zhu ........................ | G06F 1/185 361/679.58 |

* cited by examiner

*Primary Examiner* — James Wu
(74) *Attorney, Agent, or Firm* — Maschoff Brennan

(57) ABSTRACT

An interface card cage includes a first assembly and a second assembly. The first assembly includes a first side wall, a second side wall, and a bent portion. The second side wall has an opening. The bent portion and the first side wall extend in different directions. The bent portion includes a protrusion extending from the bent portion. The second assembly includes an assembly part having a slot. The assembly part includes a first side plate and a second side plate. The first side plate has a recess. The assembly part has a first edge and a second edge. A direction from the first edge to the second edge is different from a direction from the first side plate to the second side plate. The bent portion of the first assembly is located in the slot. The protrusion is located in the recess.

8 Claims, 7 Drawing Sheets

INTERFACE CARD CAGE AND SERVER

CROSS-REFERENCE TO RELATED APPLICATIONS

This non-provisional application claims priority under 35 U.S.C. § 119(a) on Patent Application No(s). 202010478042.1 filed in China, P.R.C. on May 29, 2020, the entire contents of which are hereby incorporated by reference.

BACKGROUND OF THE INVENTION

Technical Field of the Invention

The present disclosure relates to an interface card cage and a server, more particularly to an interface card cage and a server accommodating the same.

Description of the Related Art

Generally, the motherboard of the computer can provide basic performance. In order to pursue stronger hardware performance, an interface card would be additionally installed on and electrically connected to the motherboard to satisfy further requirements.

However, since other electronic components are compactly installed in the server, the internal space of the server is very limited, which is difficult to install or remove the interface card in the server. Therefore, how to easily install or remove the interface card has become an important issue in the field.

SUMMARY OF THE INVENTION

The present disclosure provides an interface card cage and a server, which is capable of allowing the interface card to be easily installed in the server.

According to one aspect of the present disclosure, an interface card cage is provided to fix a riser card and at least one interface card electrically connected to and disposed on the riser card. The interface card cage includes a first assembly and a second assembly. The first assembly includes a first side wall, a second side wall, and a bent portion. The first side wall is configured for the riser card to be disposed thereon. The second side wall is disposed between and connected to the first side wall and the bent portion. The second side wall has at least one opening configured to expose the at least one interface card. The bent portion and the first side wall respectively extend in different directions from two opposite sides of the second side wall. The bent portion includes a protrusion extending from a surface of the bent portion located away from the second side wall. The second assembly includes an assembly part. The assembly part has a slot. The assembly part includes a first side plate and a second side plate respectively located at two opposite sides of the slot. The first side plate has a recess located at one end of the slot. The assembly part has a first edge and a second edge located at two opposite sides of the recess. A direction from the first edge to the second edge is different from a direction from the first side plate to the second side plate. The bent portion of the first assembly is located in the slot. The protrusion is located in the recess.

According to another aspect of the present disclosure, a server includes a chassis, a motherboard, an interface card cage, a riser card, and at least one interface card. The motherboard is disposed in the chassis. The interface card cage includes a first assembly and a second assembly. The first assembly includes a first side wall, a second side wall, and a bent portion. The second side wall is disposed between and connected to the first side wall and the bent portion. The second side wall has at least one opening. The bent portion and the first side wall respectively extend in different directions from two opposite sides of the second side wall. The bent portion includes a protrusion extending from a surface of the bent portion located away from the second side wall. The second assembly includes an assembly part and a base part. The assembly part is disposed on the base part. The assembly part has a slot. A longitudinal axis of the slot passes through the base part. The assembly part includes a first side plate and a second side plate respectively located at two opposite sides of the slot. The first side plate has a recess located at one end of the slot located away from the base part. The assembly part has a first edge and a second edge located at two opposite sides of the recess. A direction from the first edge to the second edge is different from a direction from the first side plate to the second side plate. The bent portion of the first assembly is located in the slot. The protrusion is located in the recess. The base part is disposed in the chassis. The riser card is disposed on the first side wall of the first assembly and electrically connected to the motherboard. The at least one interface card is electrically connected to and disposed on the riser card. The at least one interface card is exposed by the at least one opening.

According to the interface card cage discussed above, the bent portion of the first assembly is located in the slot, and the protrusion is located in the recess. The movement of the bent portion of the first assembly with respect to the second assembly in one dimension is restricted by the first side plate and the second side plate, and the movement of the protrusion of the first assembly with respect to the second assembly in another dimension is restricted by the first edge and the second edge. In addition, the protrusion of the first assembly is supported by the bottom surface of the recess, and thus the movement of the protrusion of the first assembly with respect to the second assembly in the gravity direction is also restricted. Accordingly, the interface card cage with the riser card and the interface cards become single module to be easily moved to a desirable place where the interface card cage is desired to be installed.

According to the server discussed above, since the movement of the first assembly with respect to the second assembly in two dimensions and one direction are restricted, the interface card cage, the riser card, and the interface cards accommodated in the interface card cage can become single module to be easily installed in the chassis.

BRIEF DESCRIPTION OF THE DRAWINGS

The present disclosure will become more fully understood from the detailed description given hereinbelow and the accompanying drawings which are given by way of illustration only and thus are not intending to limit the present disclosure and wherein.

DETAILED DESCRIPTION

Figure 1:
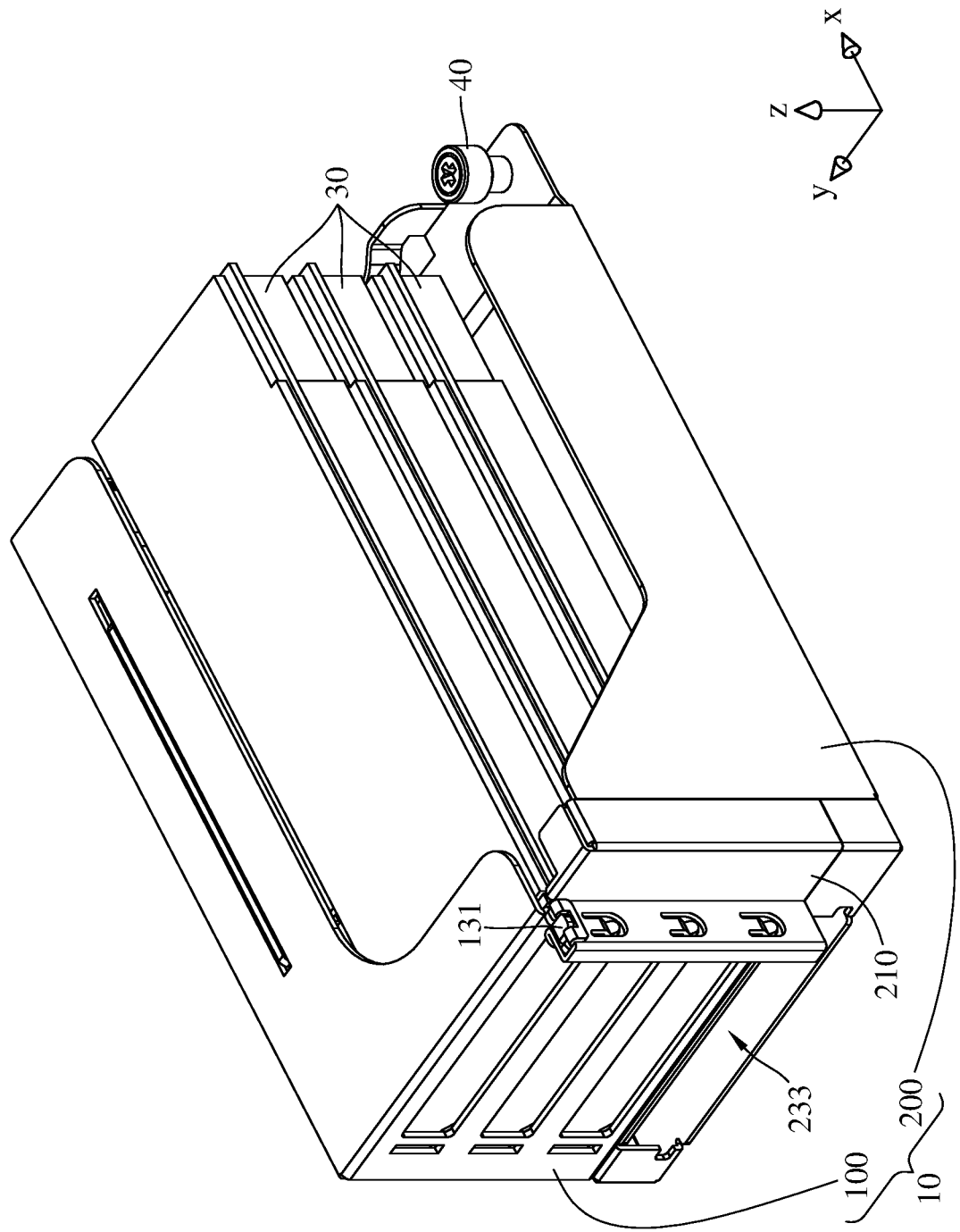
FIG. 1 is a perspective view of an interface card cage with a riser card, at least one interface card and at least one fastener according to one embodiment of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
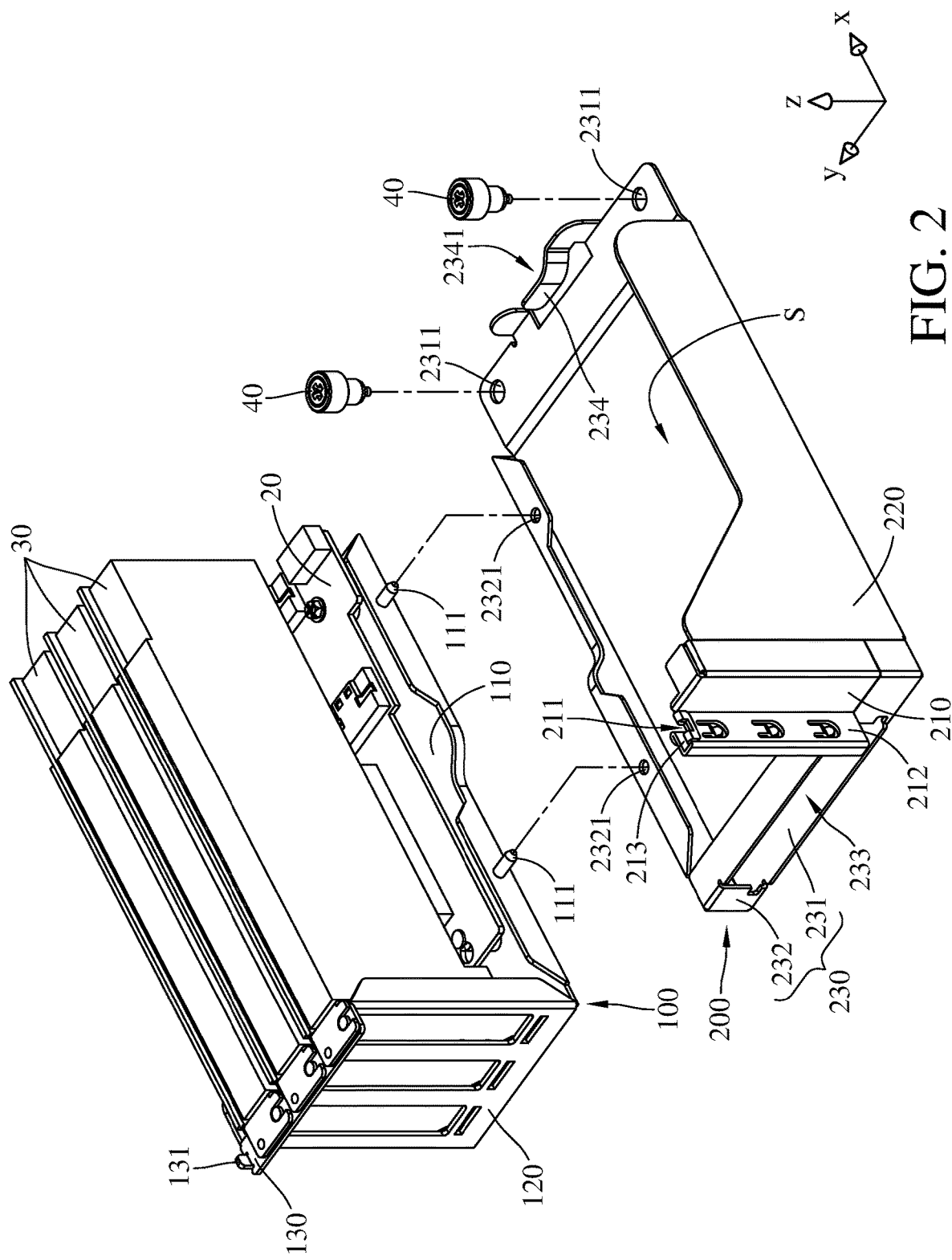
FIG. 2 is an exploded view of the interface card cage, the riser card, the at least one interface card, and the at least one fastener in FIG. 1.
Figure 3:
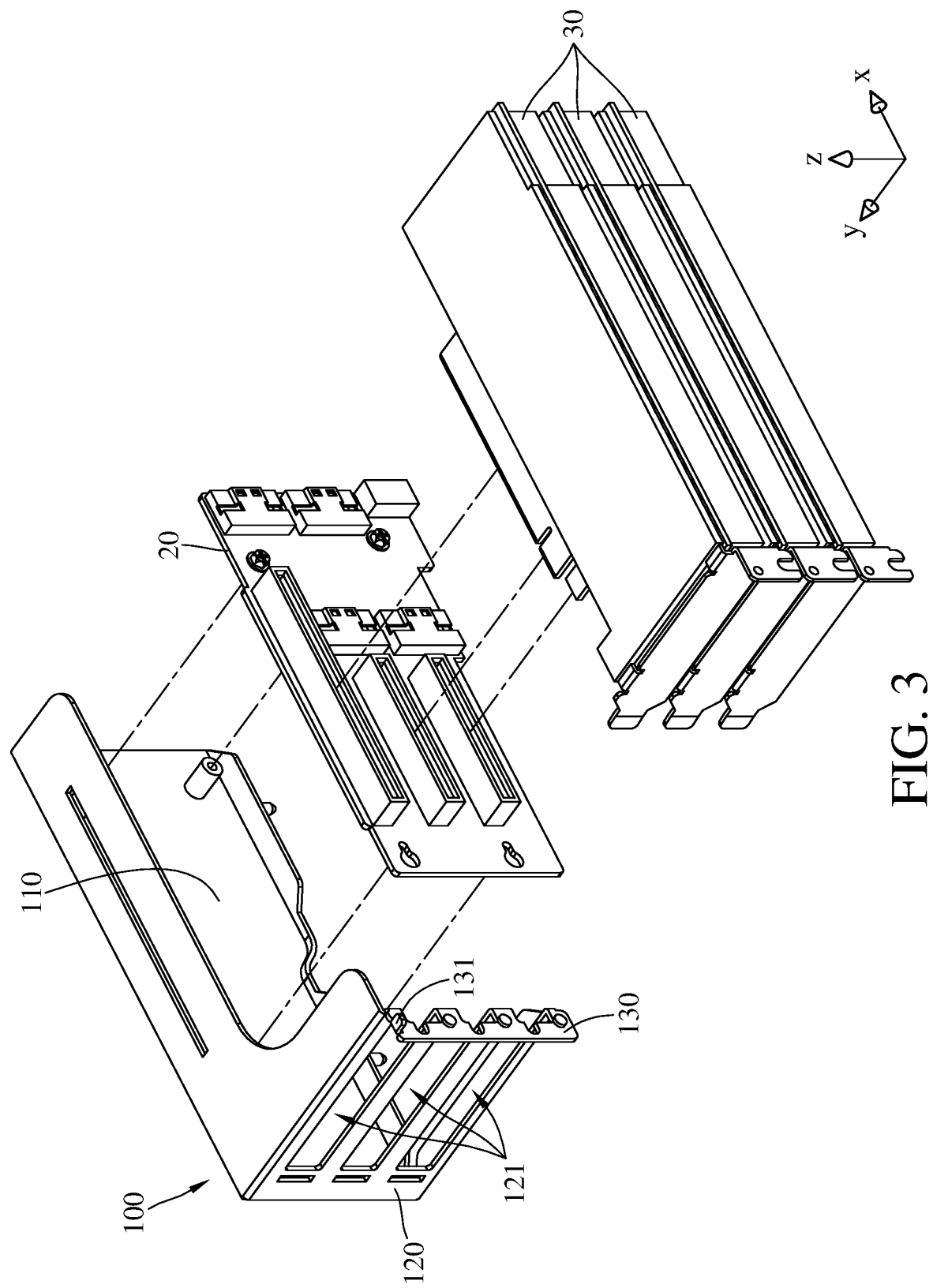
FIG. 3 is an exploded view of a first assembly of the interface card cage, the riser card, and the at least one interface card in FIG. 2.

Please refer to FIG. 1 to FIG. 3, where FIG. 1 is a perspective view of an interface card cage 10 with a riser card 20, at least one interface card 30 and at least one fastener 40 according to one embodiment of the present disclosure, FIG. 2 is an exploded view of the interface card cage 10, the riser card 20, the at least one interface card 30, and the at least one fastener 40 in FIG. 1, and FIG. 3 is an exploded view of a first assembly 100 of the interface card cage 10, the riser card 20, and the at least one interface card 30 in FIG. 2.

The interface card cage 10 provided in this embodiment is, for example, configured to fix the riser card 20 and the at least one interface card 30 electrically connected to and disposed on the riser card 20. The interface card is, for example, a peripheral component interconnect express (PCIe) interface card or a network interface card.

The interface card cage 10 includes a first assembly 100 and a second assembly 200. The first assembly 100 includes a first side wall 110, a second side wall 120, and a bent portion 130. The first side wall 110 is configured for the riser card 20 to be disposed thereon via, for example, screws. The second side wall 120 is disposed between and connected to the first side wall 110 and the bent portion 130. The second side wall 120 has at least one opening 121 configured to expose the at least one interface card 30. In detail, in this and some embodiments of the present disclosure, the quantity of the at least one opening 121 is, for example, three, and the quantity of the at least one interface card 30 is, for example, three. The three interface cards 30 may be disposed on the riser card 20, and connectors (not shown) of the interface cards 30 are exposed by the three openings 121. As such, each of the connectors of the interface cards 30 can be electrically connected to an external device (not shown). It is noted that the present disclosure is not limited to the quantities of the openings 121 and the interface cards 30. In some embodiments, the quantity of the at least one interface card may be one, and the interface card is exposed by one of the three openings. Alternatively, in some other embodiments, the quantity of the at least one opening may be one, two, four, or more, and the quantity of the at least one interface card is equal to or less than the quantity of the opening(s). In this embodiment, the bent portion 130 and the first side wall 110 respectively extend in different directions from two opposite sides of the second side wall 120. The bent portion 130 includes a protrusion 131 extending from a surface of the bent portion 130 located away from the second side wall 120 (e.g., the negative direction of Y axis shown in the drawings). The second assembly 200 includes an assembly part 210. The assembly part 210 has a slot 211.

Figure 4:
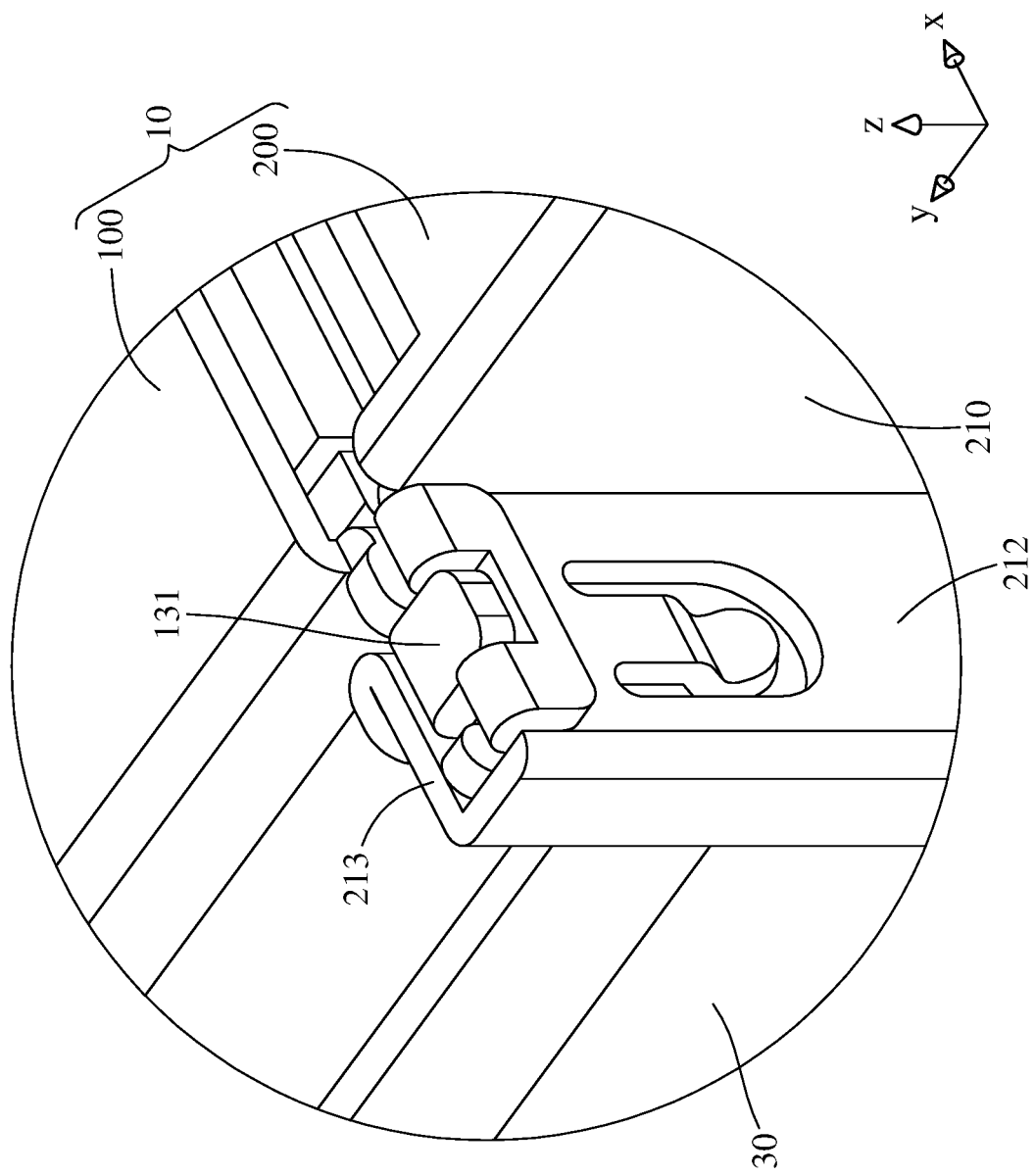
FIG. 4 is a partially enlarged view of the interface card cage and the at least one interface card in FIG. 1.
Figure 5:
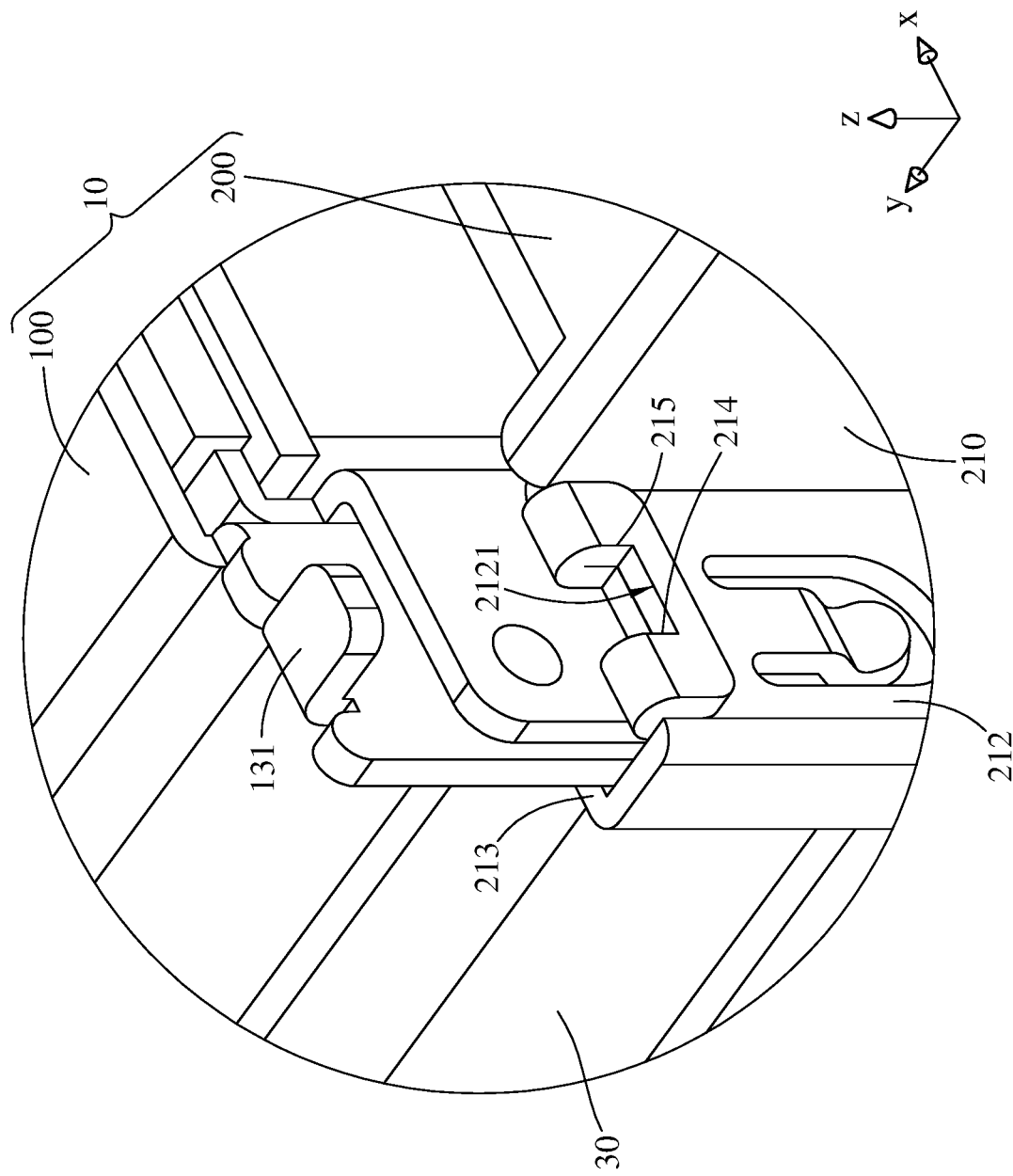
FIG. 5 is an exploded view of the interface card cage and the at least one interface card in FIG. 4.

Please further refer to FIG. 4 to FIG. 5 to describe the assembly of the first assembly 100 and the second assembly 200 hereinafter, where FIG. 4 is a partially enlarged view of the interface card cage 10 and the interface cards 30 in FIG. 1, and FIG. 5 is an exploded view of the interface card cage 10 and the interface cards 30 in FIG. 4. The assembly part 210 includes a first side plate 212 and a second side plate 213 respectively located at two opposite sides of the slot 211. The first side plate 212 has a recess 2121 located at one end of the slot 211. The assembly part 210 has a first edge 214 and a second edge 215 located at two opposite sides of the recess 2121. A direction from the first edge 214 to the second edge 215 (e.g., the positive direction of X axis shown in the drawings) is different from a direction from the first side plate 212 to the second side plate 213 (e.g., the positive direction of Y axis shown in the drawings). When the first assembly 100 is assembled with the second assembly 200, for example, in the negative direction of Z axis shown in the drawings, the bent portion 130 of the first assembly 100 is located in the slot 211, and the protrusion 131 is located in the recess 2121. As shown in the drawings, the movement of the bent portion 130 of the first assembly 100 with respect to the second assembly 200 in one dimension (e.g., Y axis shown in the drawings) is restricted by the first side plate 212 and the second side plate 213, and the movement of the protrusion 131 of the first assembly 100 with respect to the second assembly 200 in another dimension (e.g., X axis shown in the drawings) is restricted by the first edge 214 and the second edge 215. In addition, the protrusion 131 of the first assembly 100 is supported by the bottom surface (not numbered) of the recess 2121, and thus the movement of the protrusion 131 of the first assembly 100 with respect to the second assembly 200 in the gravity direction (e.g., the negative direction of Z axis shown in the drawings) is also restricted. Accordingly, when the first assembly 100 is assembled with the second assembly 200, and the riser card 20 and the interface cards 30 are installed in the interface card cage 10, the interface card cage 10 with the riser card 20 and the interface cards 30 become single module to be easily moved to a desirable place where the interface card cage 10 is desired to be installed on the premise of without purposely separating the first assembly 100 and the second assembly 200 of the interface card cage 10.

In this and some embodiments of the present disclosure, the second assembly 200 may further include a third side wall 220 disposed on the assembly part 210. When the first assembly 100 is assembled with the second assembly 200, for example, in the negative direction of Z axis shown in the drawings, the third side wall 220 is opposite to the first side wall 110. Accordingly, the interface card cage 10 with the riser card 20 and the interface cards 30 can be easily taken and moved to the desirable place by using single hand to hold the third side wall 220 and the first side wall 110. The first side wall 110, the second side wall 120, and the third side wall 220 together form an accommodation space S therebetween for accommodating the riser card 20 and the interface cards 30.

In this and some embodiments of the present disclosure, the second assembly 200 may further include a base part 230. The base part 230 include a base plate 231 and a frame portion 232. The frame portion 232 is disposed on the base plate 231, and the assembly part 210 is disposed on the frame portion 232 of the base part 230. The base plate 231 and the frame portion 232 form an opening 233 therebetween, and the opening 233 is located at a side of the base plate 231 close to the second side wall 120 and next to the opening 121. In one configuration of the present disclosure, one to three PCIe cards (e.g., interface cards 30) may be disposed on the interface card cage 10 and respectively correspond to the one to three of the openings 121, and a network interface card (not shown) may be disposed on the interface card cage 10 and correspond to the opening 233. That is, the three openings 121 and the opening 233 respectively expose one to three PCI-e cards and one network interface card, such that the connectors of these cards can be electrically connected to external devices.

In this and some embodiments of the present disclosure, the frame portion 232 of the base part 230 may have at least one positioning hole 2321, and the first side wall 110 includes at least one positioning pin 111. Specifically, the quantity of the at least one positioning hole 2321 is, for example, two, and the quantity of the at least one positioning pin 111 is, for example, two. The positioning pins 111 pass through the positioning holes 2321 and are partially located at a space formed between the frame portion 232 and the base plate 231 and connected to the opening 233. As such, by the insertions of the positioning pins 111 into the positioning holes 2321 in the negative direction of Z axis, the first assembly 100 can be assembled with the second assembly 200. In other words, the first assembly 100 is disposed on the frame portion 232 of the base part 230 of the second assembly 200. In addition, a longitudinal axis of the slot 211 (e.g., the Z axis shown in the drawings) passes through the base plate 231 of the base part 230, and the recess 2121 is located at one end of the slot 211 located away from the base plate 231 of the base part 230.

In this and some embodiments of the present disclosure, the base plate 231 of the base part 230 may have at least one through hole 2311. Specifically, the quantity of the at least one through hole 2311 is, for example, two, and the quantity of the at least one fastener 40 is, for example, two. Each of the through holes 2311 is configured for the insertion of one fastener 40 (e.g., thumb screw). Accordingly, when the interface card cage 10 is placed at the desirable place, the interface card cage 10 can be firmly fixed at the desirable place via the fasteners 40.

In this and some embodiments of the present disclosure, the base part 230 may further include a handle 234 connected to a surface of the base plate 231 of the base part 230 where the assembly part 210 and the frame portion 232 are connected. The handle 234 is opposite to the second side wall 120. The handle 234 further has a recess portion 2341 recessed, for example, along the negative direction of X axis. After the interface card cage 10 is placed at the desirable place, the interface card cage 10 can be moved therefrom by pushing the recess portion 2341 by single finger, and then the interface card cage 10 can be completely removed by holding the first side wall 110 and the third side wall 220 opposite to each other.

Figure 6:
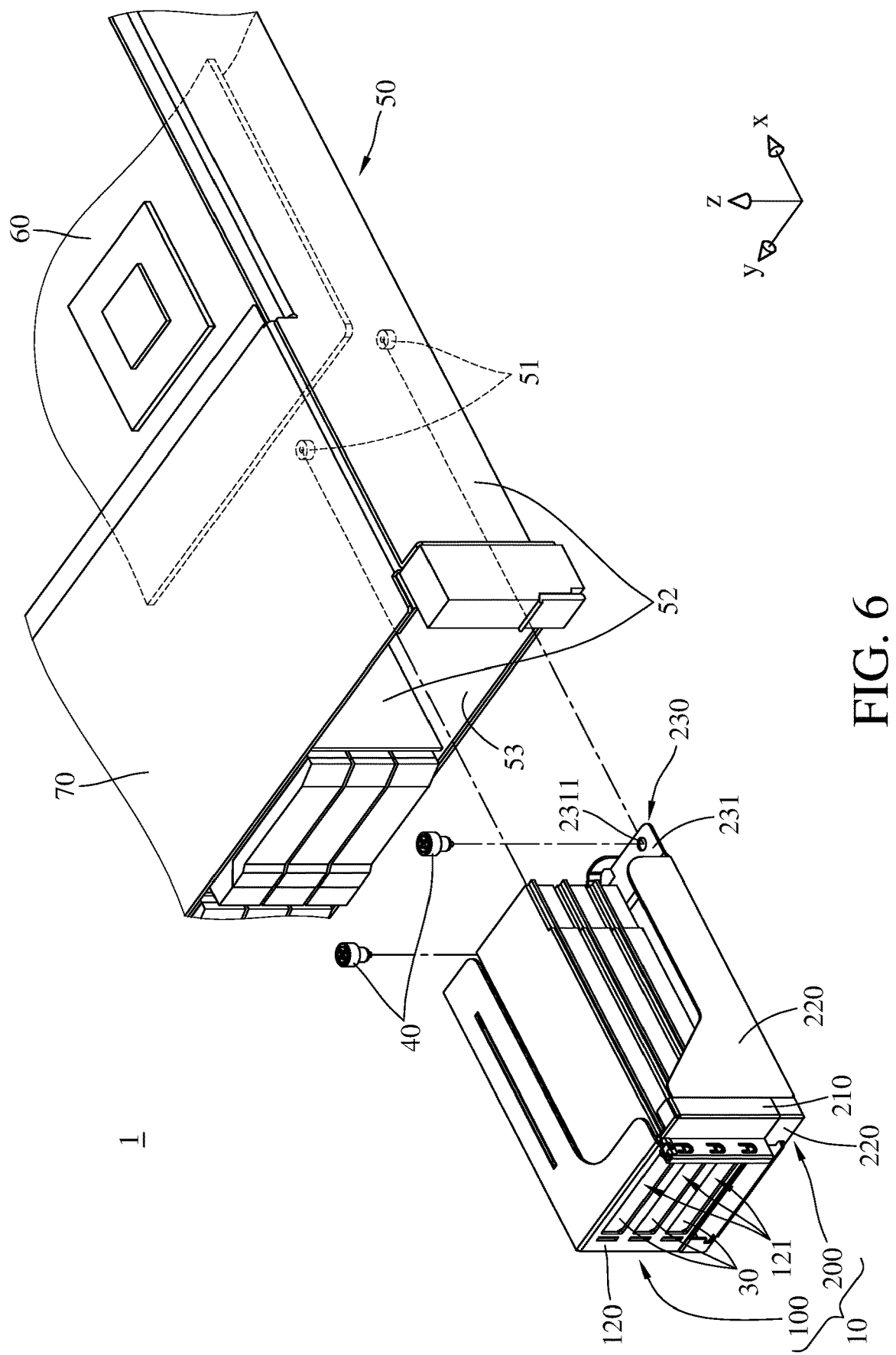
FIG. 6 is an exploded view of a server according to another embodiment of the present disclosure.
Figure 7:
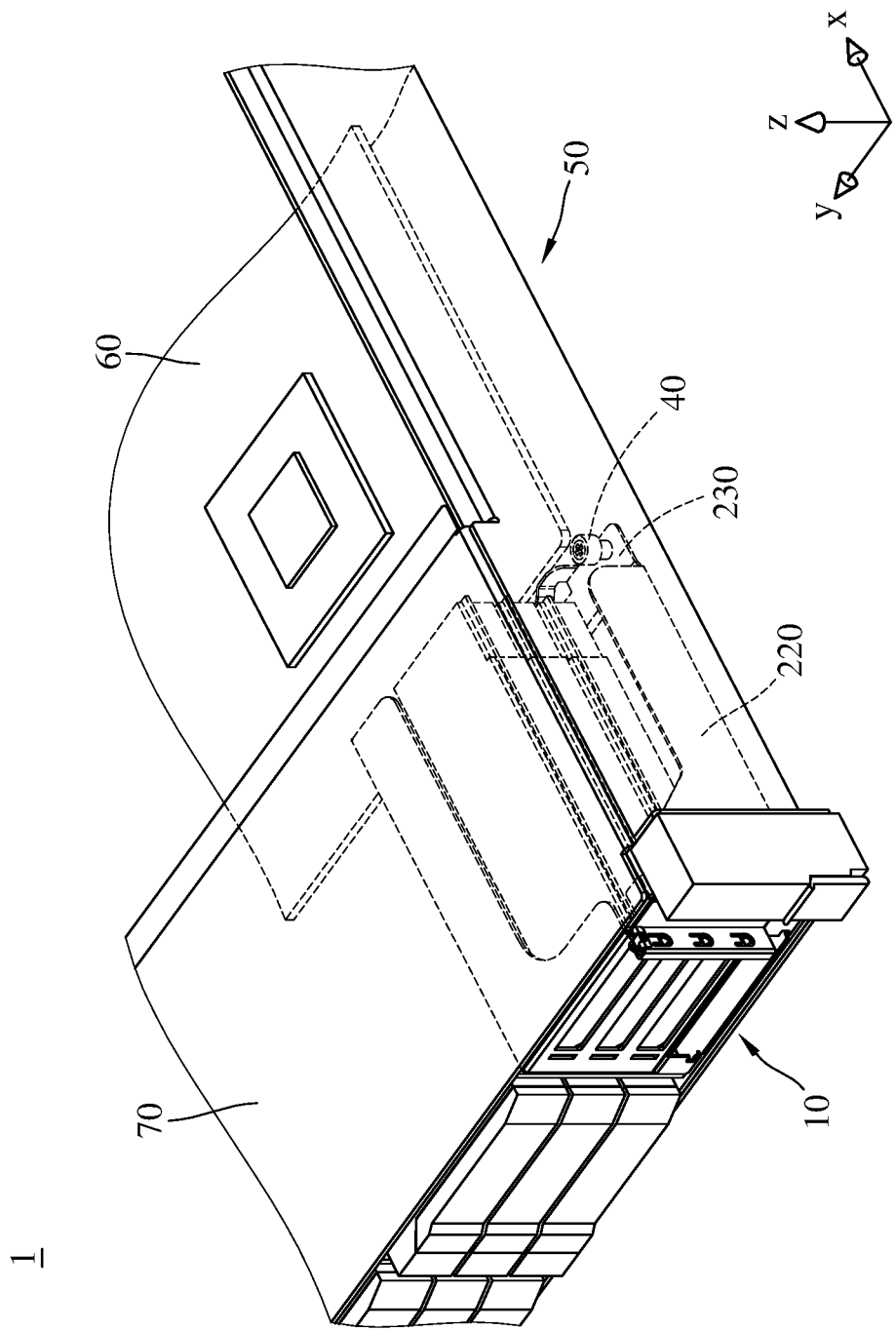
FIG. 7 is a perspective view of the server in FIG. 6.

Hereinafter, another embodiment about the interface card cage 10 disposed at the desirable place would be described. Please refer to FIG. 6 to FIG. 7, where FIG. 6 is an exploded view of a server 1 according to another embodiment of the present disclosure, and FIG. 7 is a perspective view of the server 1 in FIG. 6. Only the differences between this and the previous embodiment are illustrated hereinafter. In this and some embodiments of the present disclosure, the server 1 includes a chassis 50 and a motherboard 60 and further includes the interface card cage 10, the riser card 20 (shown in FIG. 2 and FIG. 3), and the interface cards 30 that are described in the previous embodiment. The motherboard 60 is disposed in the chassis 50. The base part 230 of the interface card cage 10 is disposed in the chassis 50. The riser card 20 is disposed on the first side wall 110 (shown in FIG. 2 and FIG. 3) of the first assembly 100 and electrically connected to the motherboard 60. The interface cards 30 are electrically connected to and disposed on the riser card 20 and exposed by the openings 121 of the second side wall 120 of the interface card cage 10. As described above, since the movement of the first assembly 100 with respect to the second assembly 200 in two dimensions and one direction (the positive direction of X axis, the negative direction of X axis, the positive direction of Y axis, the negative direction of Y axis, and the negative direction of Z axis shown in the drawings) are restricted, the interface card cage 10, the riser card 20, and the interface cards 30 accommodated in the interface card cage 10 can become single module to be easily installed in the chassis 50 on the premise of without purposely separating the first assembly 100 and the second assembly 200 in the last direction (the positive direction of Z axis shown in the drawings).

In this and some embodiments of the present disclosure, the second assembly 200 may further include a third side wall 220 disposed on the assembly part 210. When the first assembly 100 is assembled with the second assembly 200, for example, in the negative direction of Z axis shown in the drawings, the third side wall 220 is opposite to the first side wall 110. Accordingly, the interface card cage 10 with the riser card 20 and the interface cards 30 can be easily taken and moved into the chassis 50 by using single hand to hold the third side wall 220 and the first side wall 110.

In this and some embodiments of the present disclosure, the frame portion 232 of the base part 230 may have at least one positioning hole 2321 (shown in FIG. 2), and the first side wall 110 includes at least one positioning pin 111 (shown in FIG. 2). Specifically, the quantity of the at least one positioning hole 2321 is, for example, two, and the quantity of the at least one positioning pin 111 is, for example, two. The positioning pins 111 pass through the positioning holes 2321 and are partially located at a space formed between the frame portion 232 and the base plate 231 and connected to the opening 233. As such, by the insertions of the positioning pins 111 into the positioning holes 2321 in the negative direction of Z axis, the first assembly 100 can be assembled with the second assembly 200.

In this and some embodiments of the present disclosure, the server 1 may further include at least one fastener 40 (e.g., thumb screw), the base plate 231 of the base part 230 may have at least one through hole 2311, and the chassis 50 may have at least one fastening hole 51. Specifically, the quantity of the at least one fastener 40 is, for example, two, the quantity of the at least one through hole 2311 is, for example, two, and the quantity of the at least one fastening hole 51 is, for example, two. The fasteners 40 pass through the through holes 2311 to be fixed in the fastening holes 51 of the chassis 50. Accordingly, when the interface card cage 10 is placed into the chassis 50, the interface card cage 10 can be firmly fixed in the chassis 50 by the insertions of the fasteners 40 into the fastening holes 51.

In this and some embodiments of the present disclosure, the server 1 may further include a cover 70 disposed on the lateral plates 52 of the chassis 50 so as to be located opposite to and spaced apart from the bottom surface 53 of the chassis 50. When the interface card cage 10 is placed into the chassis 50, the interface card cage 10 is located between the cover 70 and the bottom surface 53 of the chassis 50, and the riser card 20 and the interface cards 30 are located between the base plate 231 of the base part 230 and the cover 70. Accordingly, the movement of the first assembly 100 with respect to the second assembly 200 in the last direction (the positive direction of Z axis shown in the drawings) can further be restricted by the cover 70.

According to the interface card cage discussed above, the bent portion of the first assembly is located in the slot, and the protrusion is located in the recess. The movement of the bent portion of the first assembly with respect to the second assembly in one dimension is restricted by the first side plate and the second side plate, and the movement of the protrusion of the first assembly with respect to the second assembly in another dimension is restricted by the first edge and the second edge. In addition, the protrusion of the first assembly is supported by the bottom surface of the recess, and thus the movement of the protrusion of the first assembly with respect to the second assembly in the gravity direction is also restricted. Accordingly, the interface card cage with the riser card and the interface cards become single module to be easily moved to a desirable place where the interface card cage is desired to be installed.

According to the server discussed above, since the movement of the first assembly with respect to the second assembly in two dimensions and one direction are restricted, the interface card cage, the riser card, and the interface cards accommodated in the interface card cage can become single module to be easily installed in the chassis.

In some embodiments, the second assembly may further include a third side wall opposite to the first side wall. Accordingly, the interface card cage with the riser card and the interface cards can be easily taken and moved to the desirable place (in some other embodiments, e.g., the chassis) by using single hand to hold the third side wall and the first side wall.

In some embodiments, the second assembly may further include a base part. The frame portion of the base part may have at least one positioning hole, and the first side wall includes at least one positioning pin. The at least one positioning pin passes through the at least one positioning hole, such that the first assembly can be assembled with the second assembly.

In some embodiments, the base plate of the base part may have at least one through hole configured for the insertion of one fastener. Accordingly, when the interface card cage is placed at the desirable place (in some other embodiments, e.g., the chassis), the interface card cage can be firmly fixed at the desirable place via the fastener.

In some embodiments, the base part may further include a handle. The handle further has a recess portion. After the interface card cage is placed at the desirable place (in some other embodiments, e.g., the chassis), the interface card cage can be moved therefrom by pushing the recess portion by single finger, and then the interface card cage can be completely removed by holding the first side wall and the third side wall opposite to each other.

In some embodiments, the server may further include a cover. The interface card cage is located between the cover and the bottom surface of the chassis. Accordingly, the movement of the first assembly with respect to the second assembly in the last direction can further be restricted by the cover.

The embodiments are chosen and described in order to best explain the principles of the present disclosure and its practical applications, to thereby enable others skilled in the art best utilize the present disclosure and various embodiments with various modifications as are suited to the particular use being contemplated. It is intended that the scope of the present disclosure is defined by the following claims and their equivalents.

What is claimed is:

1. An interface card cage, configured to fix a riser card and at least one interface card electrically connected to and disposed on the riser card, the interface card cage comprising:
   a first assembly, comprising a first side wall, a second side wall, and a bent portion, wherein the first side wall is configured for the riser card to be disposed thereon, the second side wall is disposed between and connected to the first side wall and the bent portion, the second side wall has at least one opening configured to expose the at least one interface card, the bent portion and the first side wall respectively extend in different directions from two opposite sides of the second side wall, and the bent portion comprises a protrusion extending from a surface of the bent portion located away from the second side wall; and
   a second assembly, comprising an assembly part and a base part, wherein the assembly part is disposed on the base part, the assembly part has a slot, a longitudinal axis of the slot passes through the base part, the assembly part comprises a first side plate and a second side plate respectively located at two opposite sides of the slot, the first side plate has a recess located at one end of the slot located away from the base part, the assembly part has a first edge and a second edge located at two opposite sides of the recess, and a direction from the first edge to the second edge is different from a direction from the first side plate to the second side plate,
   wherein the first assembly is disposed on the base part of the second assembly, the base part has at least one positioning hole, the first side wall comprises at least one positioning pin, the at least one positioning pin passes through the at least one positioning hole, the bent portion of the first assembly is located in the slot, and the protrusion is located in the recess.

2. The interface card cage according to claim 1, wherein the second assembly further comprises a third side wall disposed on the assembly part, the third side wall is opposite to the first side wall, and the first side wall, the second side wall, and the third side wall together form an accommodation space therebetween, and the accommodation space is configured to accommodate the riser card and the at least one interface card.

3. The interface card cage according to claim 1, wherein the base part further has at least one through hole configured for at least one fastener to pass through.

4. The interface card cage according to claim 1, wherein the base part comprises a handle connected to a surface of the base part where the assembly part is connected, and the handle is opposite to the second side wall.

5. A server, comprising:
   a chassis;
   a motherboard, disposed in the chassis;
   an interface card cage, comprising:
      a first assembly, comprising a first side wall, a second side wall, and a bent portion, wherein the second side wall is disposed between and connected to the first side wall and the bent portion, the second side wall has at least one opening, the bent portion and the first side wall respectively extend in different directions from two opposite sides of the second side wall, and the bent portion comprises a protrusion extending from a surface of the bent portion located away from the second side wall; and a second assembly, comprising an assembly part and a base part, wherein the assembly part is disposed on the base part, the assembly part has a slot, a longitudinal axis of the slot passes through the base part, the assembly part comprises a first side plate and a second side plate respectively located at two opposite sides of the slot, the first side plate has a recess located at one end of the slot located away from the base part, the assembly part has a first edge and a second edge located at two opposite sides of the recess, a direction from the first edge to the second edge is different from a direction from the first side plate to the second side plate, the bent portion of the first assembly is located in the slot, the protrusion is located in the recess, the base part is disposed in the chassis, the base part has at least one positioning hole, the first side wall comprises at least one positioning pin, and the at least one positioning pin passes through the at least one positioning hole;

a riser card, disposed on the first side wall of the first assembly and electrically connected to the motherboard; and at least one interface card, electrically connected to and disposed on the riser card, wherein the at least one interface card is exposed by the at least one opening.

6. The server according to claim 5, wherein the second assembly further comprises a third side wall disposed on the assembly part, the third side wall is opposite to the first side wall, the first side wall, the second side wall, and the third side wall together form an accommodation space therebetween, and the accommodation space is configured to accommodate the riser card and the at least one interface card.

7. The server according to claim 5, further comprising at least one fastener, wherein the base part further has at least one through hole, the chassis has at least one fastening hole, and the at least one fastener passes through the at least one through hole to be fixed in the at least one fastening hole of the chassis.

8. The server according to claim 5, further comprising a cover disposed on the chassis, wherein the riser card and the at least one interface card are located between the base part and the cover.

* * * * *